United States Patent
Emoto

(10) Patent No.: US 8,310,226 B2
(45) Date of Patent: Nov. 13, 2012

(54) DIAGNOSING DEVICE OF SIGNAL STATUS IN MEASUREMENT AND CONTROL BY MEASURING MEANS AND CONTROL MEANS

(75) Inventor: Hideaki Emoto, Tokyo (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 142 days.

(21) Appl. No.: 12/674,319

(22) PCT Filed: Jan. 9, 2009

(86) PCT No.: PCT/JP2009/050594
§ 371 (c)(1),
(2), (4) Date: Apr. 7, 2010

(87) PCT Pub. No.: WO2009/088098
PCT Pub. Date: Jul. 16, 2009

(65) Prior Publication Data
US 2010/0271007 A1    Oct. 28, 2010

(30) Foreign Application Priority Data

Jan. 11, 2008  (JP) .................. 2008-005078

(51) Int. Cl.
G01R 15/18 (2006.01)
G01R 15/20 (2006.01)
(52) U.S. Cl. .................. 324/127; 324/117 H; 324/117 R
(58) Field of Classification Search .................. 324/142, 324/127, 126, 117 H, 117 R, 762.01–762.1, 324/764.01; 257/48; 438/14–18
See application file for complete search history.

(56) References Cited

U.S. PATENT DOCUMENTS

| | | | | | |
|---|---|---|---|---|---|
| 4,126,826 | A | * | 11/1978 | Dobkin | 324/127 |
| 4,727,318 | A | * | 2/1988 | Sakai et al. | 324/762.01 |
| 4,899,103 | A | * | 2/1990 | Katzenstein | 324/99 D |
| 5,764,047 | A | * | 6/1998 | Massie | 324/117 R |

FOREIGN PATENT DOCUMENTS

| | | |
|---|---|---|
| JP | H05-091085 | 4/1993 |
| JP | H08-005708 | 1/1996 |
| JP | U3083460 | 11/2001 |
| JP | 2004-198302 | 7/2004 |
| JP | 2006-023105 | 1/2006 |
| JP | 2007-209082 | 8/2007 |

* cited by examiner

Primary Examiner — Tung X Nguyen
(74) Attorney, Agent, or Firm — Manabu Kanesaka; Benjamin J. Hauptman; Kenneth M. Berner

(57) ABSTRACT

This aims to provide a diagnosing device for detecting the measurements of an electric current, a voltage and a resistance by a temperature/moisture or pressure sensor or a signal state in control means, precisely with a simple circuit constitution, for diagnosing the soundness of a circuit while simplifying a power source circuit, to suppress the cost more than the conventional circuit having no diagnosing function, and for diagnosing the signal status in the measurement or control by a measuring means or a control means. An alternating voltage generating means containing a pulse-wave voltage and an alternating current is connected with the primary side of a transformer, and a driven member such as the measuring means for any of varying electric current, voltage and resistance is connected with the secondary side. The change in the primary-side current, which is caused with the electric power fed through an insulating transformer by the action of the driven member connected with the secondary side, is measured so that the signal status in the measuring or control means is diagnosed according to the measurement result.

4 Claims, 7 Drawing Sheets

Fig. 9A

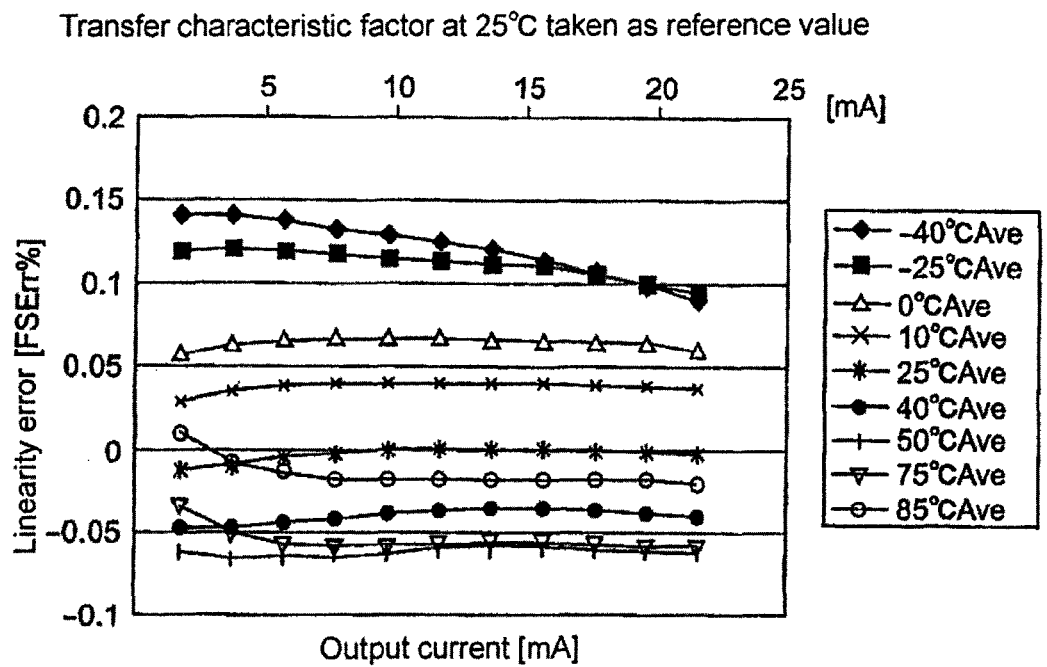

Fig. 9B

| Core material | | | PC95 |
|---|---|---|---|
| | Maker | Maker | TDK |
| | Initial permeability | $\mu i$ | 3300 |
| | Amplitude permeability | $\mu a$ | -- |
| | Unit core loss | Pcv [kW/m$^3$] | 290/@100°C |
| | Saturation magnetic flux density | Bs [nT] | 410 |
| | Residual magnetic flux density | Br [nT] | 60 |
| | Coersive force | Hc [A/m] | 6.5 |
| Core size | | | EE8 |
| | Core constant | C1 [nm$^{-1}$] | 2.75 |
| | Effective cross section | Ae [nm$^2$] | 7 |
| | Effective magnetic path | Le [nm] | 19.2 |
| | Effective volume | Ve [nm$^3$] | 134 |
| | AL value (without gap) | AL [nH/N$^2$] | 610 |
| Type of winding frame | | | BE8-116CPHFR |
| | Cross section of widing | Aw [nm$^2$] | 5.3 |
| | Average length of widing | Lw [nm] | 19.9 |
| | Width of widing frame | C [nm] | |
| | Number of pins | | 6 |

| | | Volume number | Peak voltage | Average voltage |
|---|---|---|---|---|
| Primary winding | P1 | 44 | 0.12 | 0.08 |
| | P2 | 44 | 0.12 | 0.08 |
| Secondary winding | S1 | 110 | 0.05 | 0.03 |

DIAGNOSING DEVICE OF SIGNAL STATUS IN MEASUREMENT AND CONTROL BY MEASURING MEANS AND CONTROL MEANS

RELATED APPLICATIONS

The present application is based on, International Application No. PCT/JP2009/050594, filed Jan. 9, 2009, and claims priority from, Japanese Application Number 2008-005078, filed Jan. 11, 2008, the disclosure of which is hereby incorporated by reference herein in its entirety.

TECHNICAL FIELD

The present invention relates to a signal status diagnosing device in measurement or control by a measuring means or control means, particularly those for detecting measurement results of temperature sensors, humidity sensors, pressure sensors, etc. used for controlling plants or equipment, with a high degree of accuracy by simple circuit construction, and also diagnosing the soundness of the sensor side circuit and control means side circuit.

BACKGROUND ART

As measuring or control means used for controlling plants or equipment, there have been known a measuring means like a measuring transmitter, a kind of sensor, which is supplied with electric power and converts measurement result such as temperature, humidity, and pressure into current to be outputted; a measuring means such as a sensor like a thermocouple or resistance thermometer bulb, which outputs measurement result as an analog voltage or resistance; and a control means having a contact for switching on/off upon detecting that pressure or temperature reaches a prescribed value and being utilized for detecting ambient conditions.

In such a measurement instrument or a driven object such as an actuator, the instruction side to send instruction to the plant or equipment is insulated from the side performing measurement or driving or controlling in the plant or equipment (hereafter referred to as the plant side) depending on use for the purpose of preventing affections on the human body or evading affections of noise. This is generally done by adopting an insulation transformer for transforming the voltage of the electric power supplied from the power source and insulating a measurement signal sent from the plant side to instruction side from an instruction signal or control signal sent from the instruction side to the plant side by means of a photocoupler, insulation signal relay, insulation amplifier; insulation transformer, etc.

In recent years, there has been an increased demand for performing soundness diagnosis of circuit in the field of instrumentation and measurement for the purpose of raising reliability of the system by confirming soundness of output signals and circuit wiring, that is, by confirming whether instruction signals are transmitted accurate to the control means and whether there is a breaking of wire or short circuit occurred in the circuit.

Block diagrams of FIGS. 10-13 show examples of conventional drive circuits of measuring or control means and those added with a soundness diagnosing circuit.

First, FIG. 10 is a block diagram of a circuit in the case of a sensor such as a measuring transmitter, which is supplied with electric power and outputs measurement results of temperature, humidity, and pressure converting them into analog signals. A voltage of 24V, for example, is applied to a measuring transmitter 100, and electric power is supplied to a signal conversion circuit 108, and modulation circuit 109, from a power source circuit 101.

The power source circuit 101 consists of a pulse generating circuit 103 for converting electric power supplied from a power source 102 into pulse voltage, an insulation transformer 104 for changing the voltage of the pulse voltage from the pulse generating circuit 103 and insulates the plant side from instruction side, a rectifying circuit 105 for rectifying the pulse voltage increased by the insulation transformer 104, and a constant-voltage circuit 106 for smoothing the rectified pulse voltage into a constant voltage.

The signal conversion circuit 108 and modulation circuit 109 are for inputting the analog results measurement of the measuring transformer 10 such as temperature, humidity and pressure as voltage signals to the insulation transformer 110 used for dividing the measurement transmitter 100 side from the instruction side. The measurement transmitter 100 can not input the measurement signals to the insulation transformer 110, because electric currents generated by the temperature, humidity and pressure sensors are currents varying in a range of about 4~20 mA. Therefore, the measurement results obtained as electric currents can not be inputted as it is in the insulation transformer, so, the current signals are converted into voltage signals by the signal conversion circuit 108, and further converted into alternating voltage signals by the modulating circuit 109 to be inputted to the insulation transformer 110. Then, the output of the insulation transformer 100 is reconverted to a current or voltage signal 112 to be outputted outside as measurement results.

A broken line denoted by reference numeral 107 in FIG. 18 represents an insulation barrier insulating the measuring side (instruction side) from the measuring device side (plant side). In the following explanation, constituent components similar to those in FIG. 10 are denoted by the same reference numerals and detailed explanation is omitted.

FIG. 11 is a block diagram of a circuit in the case of a sensor such as a thermocouple and resistance thermometer bulb, which outputs measurement result as a change in voltage and electric resistance.

The power source circuit 101 consists, similarly to the case of FIG. 11, of a power source 102, pulse generating circuit 103, insulation transformer 104, and rectifying circuit 105, constant-voltage circuit 106. Electric power is supplied to a signal conversion circuit 121 and modulation circuit 122. The voltage signals and resistance signals from thermocouples and resistance thermometer bulb are converted into voltage signals by the signal conversion circuit 121 and modulated by the modulation circuit 122, amplified by an insulation transformer 123 which is a signal insulating means to insulate the plant side from instruction side, then the output from the insulation transformer 123 is reconverted into current or voltage signals 125 by a demodulating circuit 124 to be outputted outside as measurement results.

FIGS. 12 and 13 are block diagrams of circuit in a case of a control means having a contact (hereafter referred to the contact depending on circumstances) for switching on/off upon detecting that pressure or temperature reaches a prescribed value and being utilized for detecting ambient conditions. The electric power source circuit 101 for driving contacts 140 and 143 for outputting ON/OFF signals depending on pressure and temperature consists of an electric power source 102, a pulse generating circuit 103, an insulation transformer 104, a rectifying circuit 105, and a constant voltage circuit 106 similarly to the case of FIG. 10 and FIG. 11. In this way, even when there are a plurality of contacts in the circuit, generally a single electric power source circuit is adopted as a common power source from a viewpoint of cost saving. Signals for switching on/off the contacts 140 and 143 are sent to photocouplers 141 and 144, which are signal insulation means provided to insulate the plant side from the instruction side. Light emitting elements constituting the photocouplers 141 and 144 emit light when the contacts are "ON" respectively, and binary signals 142 and 145 of ON/OFF are outputted to outside from light-sensitive elements respectively to transmit temperature and pressure of the plant side to the instruction side.

In the circuits shown in FIGS. 11 and 12, circuit soundness such as occurrence of a breaking of wire or short circuit can be judged to some extent from conditions that the measurement result is not transmitted to the instruction side or that the measurement result does not vary from a constant value. However, in the circuit shown in FIG. 12, when intending to soundness diagnosis of circuit, it is necessary to confirm whether the control means (contacts) are operating normally in addition to confirm whether there is a breaking of wire or short circuit. To confirm whether the control means is operating normally or not can not be performed without composing the circuit to match the purpose.

Therefore, in the circuit of FIG. 13 in which soundness diagnosis can be performed, the diagnosis is performed by providing a block 146, in which status signal of ON/OFF of the contacts 140, 143 are perceived in an analog fashion using A/D conversion function contained in an microcomputer and evaluated to judge the state of ON/OFF of the contacts, whether there is a short circuit or malfunction of the contacts, and whether there is a breaking of wire or short circuit occurred in the circuit.

The result is sent to the photocoupler 141 which is an insulation means for insulating the plant side from the instruction side, and outputted as a serial communication signal to a communication signal receiving part 147.

As mentioned above, in the conventional circuit, the measuring transmitter 100 and control means (contacts), 140,143, etc. are driven, and insulation interfaces between measuring side and control side are implemented by providing an insulation electric power source 101 of 24V for example which includes the insulation transformer 104 and constant voltage circuit 106 for the purpose of driving the signal conversion circuit, modulating circuit, and microcomputer; an insulation amplifier which includes the insulation transformer 110 or 123; and the photocouplers 141, 144 as insulation means.

Further, when signals from a plurality of contacts are to be received insulated from one another as shown in FIGS. 12 and 13, generally a single electric power source is provided for a plurality of contacts for common use from a point of view of cost saving. Therefore, when the contacts are located at two or more locations remote from one another, voltage differences caused by voltage drop due to difference of length of signal cables has a considerable influence on the circuit system, so, it has been necessary fundamentally to evaluate the state of contacts located near to one another. Furthermore, as a common electric power source is used, signals are evaluated in an analog fashion in the input sides of the insulation means (i.e. the plant side) when a circuit soundness diagnosing function is added to the circuit.

Therefore, there have been problems as follows in the conventional circuits for measurement and control and soundness diagnosing circuit for confirming whether there is a breaking of wire or short circuit:

(A) Circuits for constant voltage, and modulation and demodulation of signals, are needed, which has resulted in increased cost.

(B) It has been usual that a single insulation electric power source is used for a plurality of control means in common because insulation electric power source is expensive. Therefore, when two or more control means are located from each other, voltage difference caused by voltage drop due to difference of length of signal cables has a considerable influence on the circuit system, so, it is necessary fundamentally to evaluate signals of the control means located near to one another.

As to the art for detect braking of wire, there are disclosed for example in patent literature 1 (Japanese Laid-Open Patent Application No. 2006-023105) a method of detecting breaking of wire by applying a pulse signal to the wire, and comparing the current wave shape measured with the reference current wave shape to judge the presence or absence of breaking of wire from difference in both the wave shapes, and in patent literature 2 (Japanese Laid-Open Patent Application No. 2004-198302) a circuit for detecting breaking of wire by applying a pulse signal for checking via an impedance component to the signal wire for detecting breaking of wire, and comparing the signal obtained from the signal wire with the pulse signal for checking to judge the presence or absence of breaking of wire.

As to diagnosis of electric circuits, there is disclosed for example in patent literature 3 (Japanese Laid-Open Patent Application No. 8-005708) a method of diagnosing electric circuits and diagnosing device used for the method. With which conditions of electric apparatuses are diagnosed for the purpose of improving efficiency of diagnosis operation by facilitating measurement record management and further decreasing occurrence of man-caused errors, by reading out information written and stored in a nonvolatile memory concerning measurement results of characteristics or things concerning measurement of the electric apparatuses, or measurement results of characteristics or things concerning measurement of the electric apparatuses, and comparing the read-out information with the information of-the-moment concerning measurement results of characteristics or things concerning measurement of the electric apparatuses.

However, with the art taught in the patent literature 1 and 2, means for applying pulse signals and a memory for memorizing reference current wave shape are needed, and with the electric circuit diagnosing device disclosed in the patent literature 3, a memory memorized information concerning measurement results of characteristics or things concerning measurement of the electric apparatuses is needed, and further a means for measuring characteristics of the circuit and a means, for comparing the measurement result with the reference data, resulting in complicated composition. Therefore, problems cited in the items (A) and (B) can not be solved by these art.

SUMMARY OF THE INVENTION

Therefore, the object of the invention is to provide a signal status diagnosing device in measurement or control by a measuring means or control means, which can perform measurement of current, voltage, or resistance of a temperature sensor, humidity sensor, or pressure sensor, etc., or detection of control state of a control means with a high degree of accuracy and simple construction, and also can perform circuit soundness diagnosis while simplifying the electric power source circuit so that the circuit of the device can be manufactured keeping a lid on cost as compared with the conventional circuit without diagnosing function.

To achieve the object, the present invention proposes a device for diagnosing signal status in measurement and control by a driven object, the device having; a signal generating means for generating a periodically vibrating voltage including a pulse voltage and alternating voltage connected to the primary side of a transformer; and a measuring means of which any one of current or voltage or resistance varies, or a driven object which converts change of state of a subject to be controlled into anyone of change of current or voltage or resistance connected to the secondary side of the transformer; wherein the transformer is an insulation transformer of which the primary side is insulated from the secondary side and the primary winding is provided with an intermediate tap, and a current measuring means is connected to the intermediate tap to measure a current in the primary side of the transformer caused by a current flow in the driven object connected to the secondary side via a rectifying circuit, whereby change in any one of the current or voltage or resistance of the driven object is estimated and soundness diagnosis of circuit is performed based on measurement result of the current measuring means.

In this way, by measuring change in the primary side current caused by the consumption of electric power sent via the insulation transformer to the driven object connected to the secondary side of the insulation transformer, signal status of the driven object can be detected and circuit soundness can be diagnosed based on the measurement result. The device does not need a constant voltage circuit, circuit for signal conversion, modulation, and demodulation as are needed in the conventional device, and can perform estimation of measurement result of the sensor or control means with very simple construction and high accuracy without increase in manufacturing cost due to increase of the number of parts and complication of circuit by providing diagnosing function.

It is a preferable embodiment of the invention to compose such that the driven object is a measuring transmitter which outputs measurement result as analog current, change in a current in the primary side of the transformer caused by a current applied to the measuring transmitter via the rectifying circuit is measured by the current measuring means connected to the intermediate tap of the transformer; or to compose such that the driven object is a sensor which outputs measurement result as a voltage or change in resistance, a signal conversion circuit for converting the output of the sensor into a current is provided, and change in a current in the primary side of the transformer caused by a current which flows from the sensor to the signal conversion circuit is measured by the current measuring means connected to the intermediate tap of the transformer.

Further, the invention proposes a device for diagnosing signal status in measurement and control according to claim 1, wherein the driven object is a control means which switches on/off in accordance with ambient conditions such as pressure, temperature, and humidity; a means for switching over to select different resistance in accordance with ON/OFF state of the control means is provided, whereby change in a current in the primary side of the transformer caused by a current which flows from the rectifying circuit through the resistance selected is measured by the current measuring means connected to the intermediate tap of the transformer; and a diagnosing means is provided which detects whether the control means is switched-on or -off and diagnoses circuit soundness.

The diagnosing means can be provided in the primary side (instruction side) of the insulation transformer, and as the constant voltage circuit is not needed as in the conventional device, even in a case there are a plurality of control means, it is possible to provide an insulation transformer for each of the control means.

As has been described heretofore, according to the invention, the device for diagnosing signal status in measurement or control by a measuring means or control means does not need a constant voltage circuit, circuits for signal conversion, modulation, and demodulation as are needed in the conventional circuit. Therefore, as to insulation means, only a insulation transformer which is comparatively not so expensive is needed, and the device is advantageous on the cost front. Further, as the insulation transformer is comparatively inexpensive, it becomes possible to provide an insulation transformer for each of a plurality of control means, and a device for diagnosing signal status in measurement or control which is compact in construction evading increase of the number of parts thereby preventing increase in cost, and can estimate measurement result and diagnose circuit soundness with high accuracy, can be provided.

BRIEF DESCRIPTION OF THE DRAWINGS

FIG. 9A is a graph of a test result showing linearity error of transfer characteristic of the transformer used in the invention (linearity error for various core temperature between −40~85° C. taking the transfer characterization factor at 25° C. as the reference value), and FIG. 9B is table showing the specifications of the transformer used in the test.

DETAILED DESCRIPTION OF THE PREFERRED EMBODIMENTS

Preferred embodiments of the present invention will now be detailed with reference to the accompanying drawings. It is intended, however, that unless particularly specified, dimensions, materials, relative positions and so forth of the constituent parts in the embodiments shall be interpreted as illustrative only not as limitative of the scope of the present invention.

Figure 1:
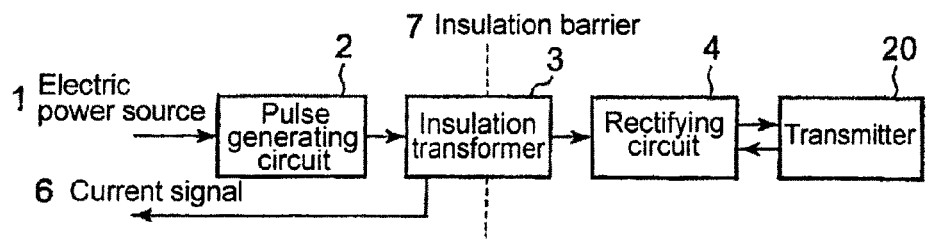
FIG. 1 is a block diagram of a circuit according to the invention for driving a measuring means such as a transmitter for measurement which is a kind of sensor for outputting measurement result of temperature, humidity and pressure, converting them into analog current with electric power supplied.
Figure 2:
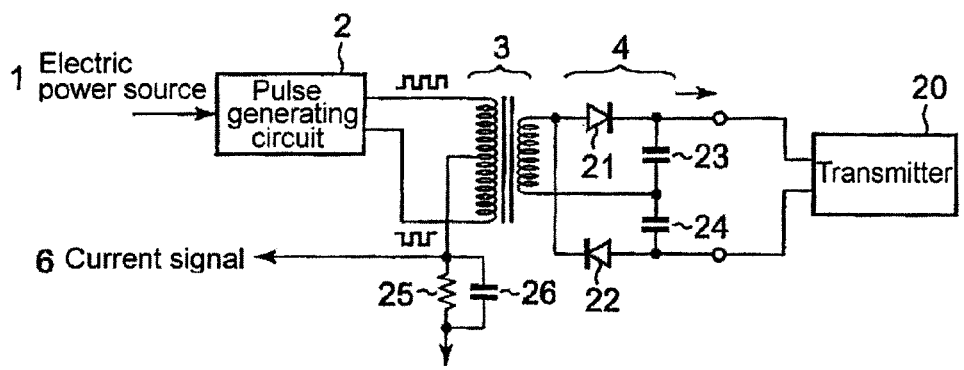
FIG. 2 is a diagram showing a circuitry according to the invention for driving a measuring means such as a transmitter for measurement which is a kind of sensor for outputting measurement result of temperature, humidity and pressure, converting them into analog current with electric power supplied.
Figure 10:
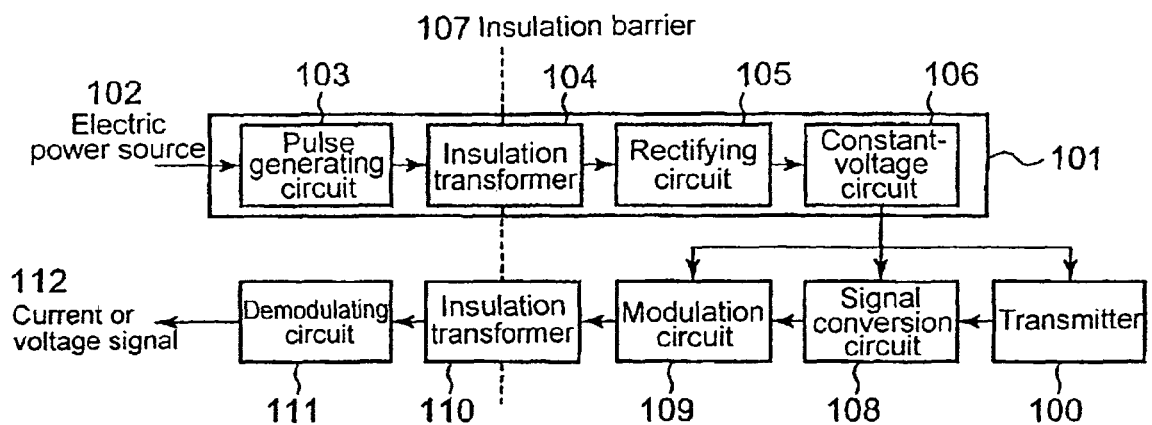
FIG. 10 is a block diagram of a conventional circuit for measuring temperature, humidity and pressure using a transmitter for measurement which is a kind of sensor for outputting measurement result of temperature, humidity and pressure, converting them into analog current with electric.

FIG. 1 and FIG. 2 is respectively a block diagram and an example of concrete circuitry correspond to the case of FIG. 10, i.e. in the case of a sensor such as a measuring transmitter, which is supplied with electric power and outputs measurement results of temperature, humidity, and pressure converting them into analog signals. In FIG. 1, reference numeral 1 is an electric power source, 2 is a pulse generating circuit, 3 is an insulation transformer, is a rectifying circuit, 20 is a transmitter for measurement as a driven object, 6 is a current signal flowing in the primary coil of the insulation transformer 3, and a broken line 7 indicates an insulation barrier between the plant side and instruction side. In FIG. 2, reference numeral 21, 22 is a diode composing the rectifying circuit 4, reference numeral 23, 24 is a condenser also composing the rectifying circuit 4, numeral 25 is a resistance for measuring current, and 26 is a condenser. The current 6 flowing in the primary side of the insulation transformer 3 is measured by an ammeter not shown in the drawings. The pulse generated by the pulse generating circuit is preferable to be a rectangular wave, it may of course be an alternating sine curve signal.

First, the present invention will be explained briefly. The device of the invention is composed such that, a pulse generating circuit which generates a pulse receiving electric power from the power source 1 is connected to the primary side of the insulation transformer 3; to the secondary side thereof is connected a driven object, of which the signal state varies depending on measuring or controlling state of a control means (hereafter referred to as the contact depending on circumstances) having a contact which is switched on/off in accordance with temperature or pressure such as a measuring transmitter 20 like a sensor; change in the current 6 caused by the consumption of electric power by the driven object connected to the secondary side of the transformer is measured; and change in signal status in the measurement or control means is detected and at the same time whether there is a breaking of wire or short circuit occurred in the circuit is diagnosed, that is, the soundness of circuit is diagnosed.

As mentioned above, according to the signal status diagnosing device in measurement or control by a measurement means or control means, although basically the same component and circuits such as the pulse generating circuit 2, insulation transformer 3, and rectifying circuit 4, are used as are in the conventional electric power source circuit 101, the primary side current of the insulation transformer is measured and the current flowing or consumed in the driven object is estimated based on the measured current without providing the rectifying, signal conversion, modulating, and demodulating circuits, and signal status can be detected including soundness of the connected object based on the estimation.

As has been described above, according to the invention, the current used to drive the actuator 80 is estimated based on the current which flows in the primary side of the insulation transformer 3 corresponding to the current which flows in the secondary side thereof, and at the same time a braking of wire and short circuit can be diagnosed by flowing always a weak current in the circuit.

When performing driving of driven object and diagnosing of the circuit using the electric power source not provided with the constant voltage circuit and measuring change in the primary side current caused by the consumption of electric power by the operation of the driven object, particularly in the case of analog signal transmission, there arises a problem of accuracy. Particularly, in the circuit system like this, energy loss in the insulation transformer becomes an error for the transmitted energy. However, when the error in the signal transmission is smaller than a required accuracy range, there is no problem. For example, when error of about 0.2%~0.25% is permissible, conventional transformer can be adopted.

When more precision is required, for example, error must be smaller than 0.1%, change of core loss depending on temperature of the transformer becomes most problematic. However, when the core loss is nearly constant in relation to temperature, it is no matter to judge the measurement result with high accuracy taking temperature into consideration, and measurement and transfer of analog signals is made possible with high accuracy.

Figure 7:
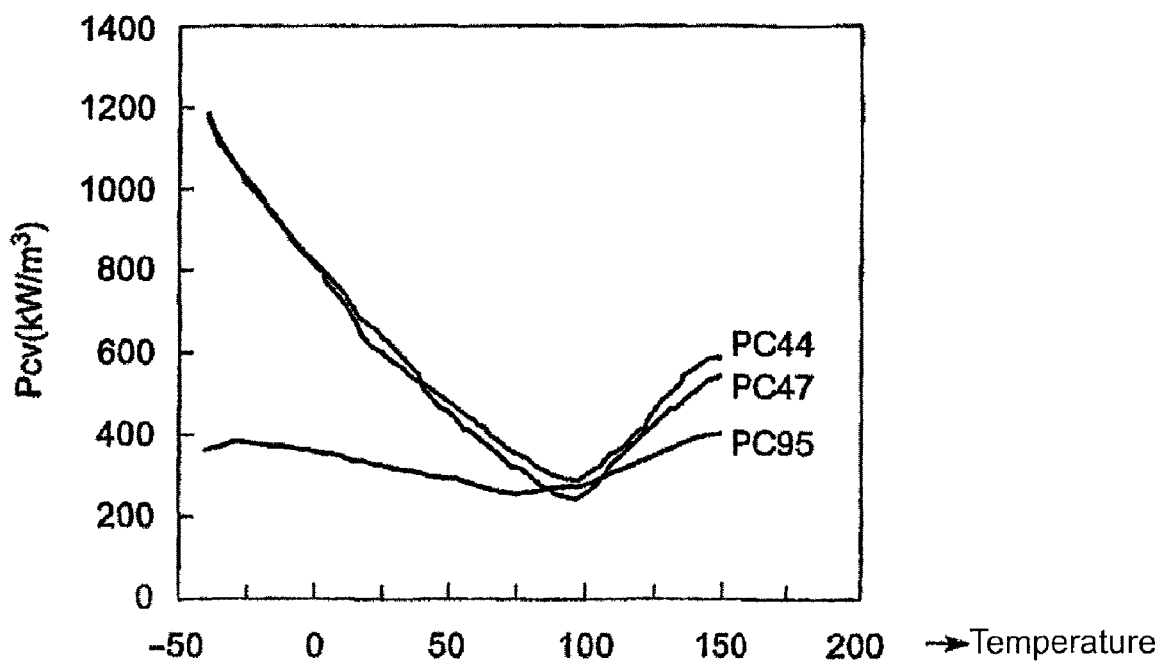
FIG. 7 is a graph showing core loss (electric power loss) vs. temperature characteristic of the core material used in the transformer of the invention.
Figure 8:
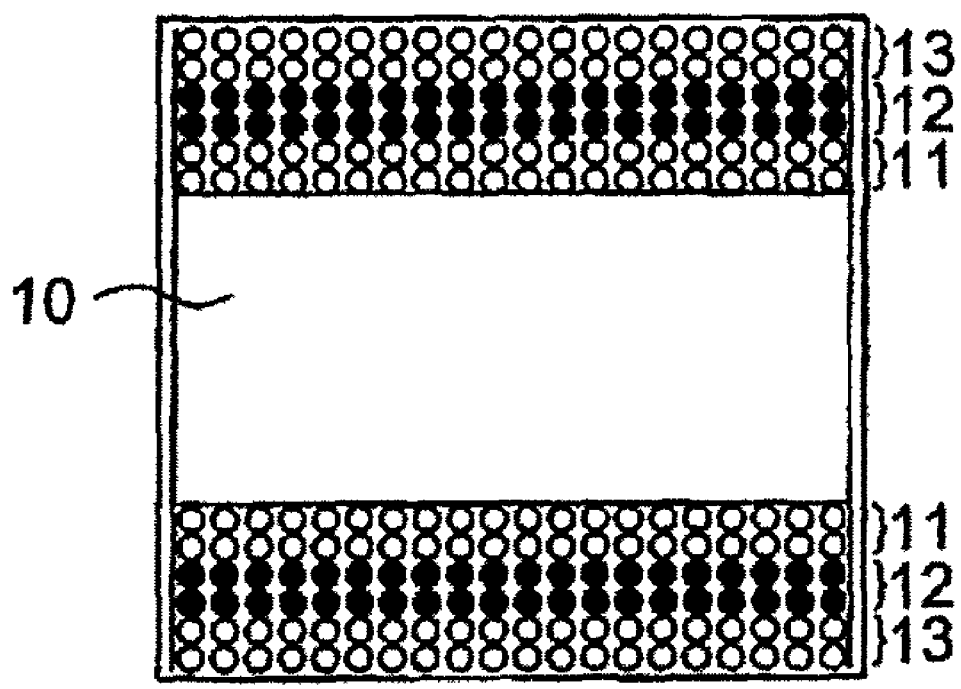
FIG. 8 is a pattern diagram showing winding of the primary and secondary coil around the core of the transformer used in the invention.

FIG. 7 is a graph showing core loss characteristic (loss power ($kW/cm^3$) vs. temperature (° C.)) of several core materials. Core materials PC44 and PC47 of TDK Ltd. made which has a peak value at near 100° C., however, PC95 also of TDK Ltd. made has a relatively flat core loss characteristic. In the invention, PC95 was adopted as the core material of the insulation transformer. By this, a signal status diagnosing device can be provided which performs diagnosis of the status of signals in the measurement and control means in the driven object with high accuracy.

Figure 5:
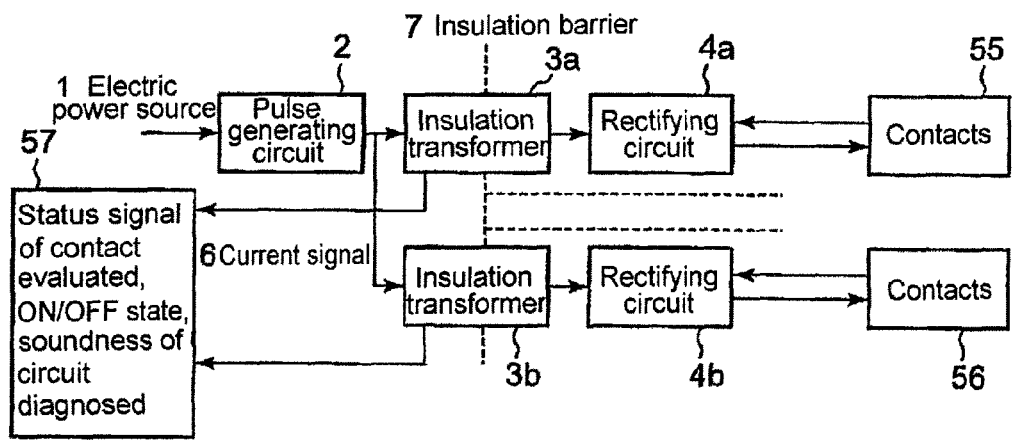
FIG. 5 is a block diagram of a circuit according to the invention for driving a control means having a contact for switching on and off upon detecting that pressure or temperature reaches a prescribed value utilized for detecting ambient conditions.

Further, the inventors of the application composed a transformer such that an intermediate tap is provided in an intermediate part of the primary winding, a current measuring means is connected to the intermediate tap, and change of primary side current caused by consumption of current supplied to the secondary side. As shown in FIG. 5, the primary coil is divided into an anterior half 11 and posterior half 13 such that a secondary coil 12 is sandwiched by both the primary coil 11 and 13, and the intermediate tap is taken out from the center of the primary coil. The inventors found out that a favorable signal transfer characteristic can be obtained with this composition of a transformer using PC95 as core material.

Figure 6A:
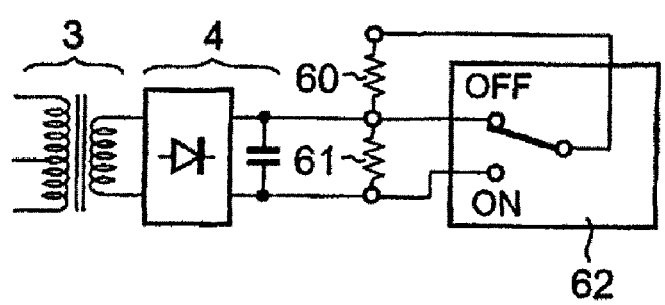
FIG. 6A is a diagram of a circuitry according to the invention for driving a control means having a contact for switching on and off upon detecting that pressure or temperature reaches a prescribed value utilized for detecting ambient conditions and FIG. 6B is a graph showing the range of the primary current of the transformer corresponding to the operating state of the control means.

FIG. 6A is a graph showing a test result. The test was performed composing a distributor-isolation-amplifier using a insulation transformer composed using PC95 of TDK made as core material and arranging primary and secondary windings as shown in FIG. 5. Linearity and temperature drift were measured.

Figure 6B:
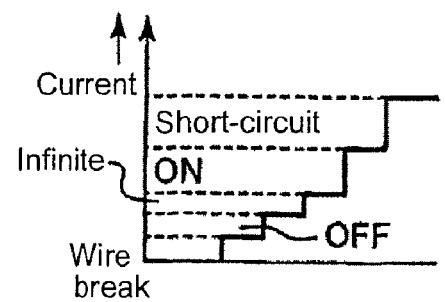

Specification of the insulation transformer used in the test is shown in the table of FIG. 6B. Measurement was performed using a precision resistance of accuracy of 10 ppm/° C.

In FIG. 6A is shown linearity errors of transfer characteristics for temperatures between −40~85° C., in which output currents (mA) of the distributor-isolation-amplifier are plotted as the abscissa and full scale errors % (4~20 mA is taken as 100%) are plotted as the ordinate, with the transfer characteristic factor at 25° C. taken as the reference value.

In the case of the conventional transformer composed by using PC44 or PC47 as core material to have a single primary coil not divided in two as shown in FIG. 5 and a secondary coil wound over the primary coil, linearity is ±0.05% or smaller, and about ±0.25% under environment of 0~60° C. Therefore, as can be recognized from FIG. 6A that, by composing the insulation transformer as described before, linearity of ±0.01% or smaller, about ±0.1% under environment of 0~85° C., and about 0.15%~−0.1% under environment of −40~85° C. can be attained. It is thinkable that further improvement in accuracy and temperature characteristic can be attained by innovations in shape and size and increase of the number of winding of the insulation transformer.

In the block diagram of FIG. 1, the pulse generated by the pulse generating circuit 2 is raised in voltage by the insulation transformer 3, rectified by the rectifying circuit 4, and applied to the measuring transmitter 20 at 24V for example. Then, a current of 4~20 mA flows in the measuring transmitter 20 in accordance with temperature, humidity, and pressure measured. Therefore, in the primary side of the insulation transformer 3 flows a current corresponding to the current of measurement result flowing in the measuring transmitter 20, so, the current in the measuring transmitter 20 can be estimated by measuring the primary side current taken out from the intermediate tap as a primary side signal current 6 by an ammeter not shown in the drawings. Further, with this circuit, when there occurs a trouble such as a breaking of wire or short circuit in the circuit of the secondary side of the insulation transformer 3, a phenomenon occurs that the primary side signal current 6 becomes 0 or excessively large, so, soundness of the circuit can be diagnosed concurrently with the driving of the measuring transmitter 20.

In FIG. 2 showing the concrete circuitry of the block diagram of FIG. 1, diodes 21 and 22, and condensers 23 and 24 are connected to the secondary side of the insulation transformer 3 so as to compose a full wave rectifying circuit, and to the output side thereof is connected the measuring transmitter 20 as a measuring means, current flow in which varies in accordance with temperature, pressure, etc. thereof.

The pulse generated by the pulse generating circuit 2 driven by the electric power source 1 is applied alternately to both the ends of the primary winding of the insulation transformer 3. The insulation transfer 3 has an intermediate tap at the midpoint the primary winding, the resistance 25 and condenser 26 are connected in parallel to the intermediate tap, and the current signal 6 is taken out from the connection point of the resistance and condenser to be measured by an ammeter not shown in the drawing. By applying the pulse from the pulse generating circuit 2 to both the ends of the primary winding of the insulation transformer 3 in this way, current applied from the pulse generating circuit 2 via the insulation transformer 3 to the measuring transmitter 20 can be estimated.

In the circuit composed like this, when current varies in the measuring transmitter 20 in accordance with the temperature or pressure, etc. measured, a current flow in the primary side corresponding to the change in the current in the measuring transmitter 20. Therefore, by measuring the primary side current, the current flows in the measuring transmitter, i.e. measurement result of the measuring transmitter 20 can be estimated. Furthermore, as mentioned above, when there occurs a breaking of wire or short circuit in the circuit in the secondary side of the insulation circuit 3, it can be detected by a phenomenon that the primary side current 6 becomes 0 or excessively large, thus the soundness of circuit can be diagnosed.

Figure 3:
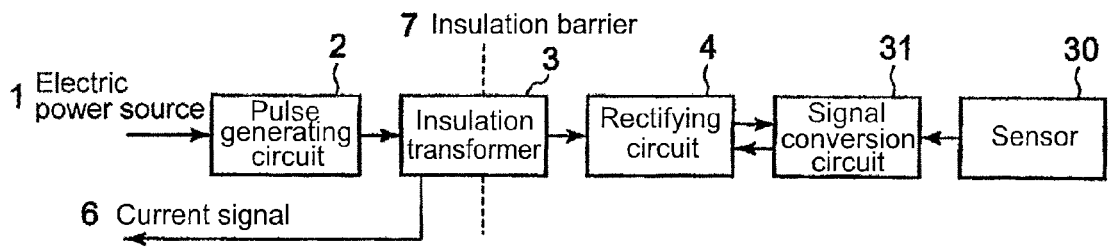
FIG. 3 is a block diagram of a circuit according to the invention for driving a sensor which outputs measurement result as change in voltage or electric resistance.
Figure 4:
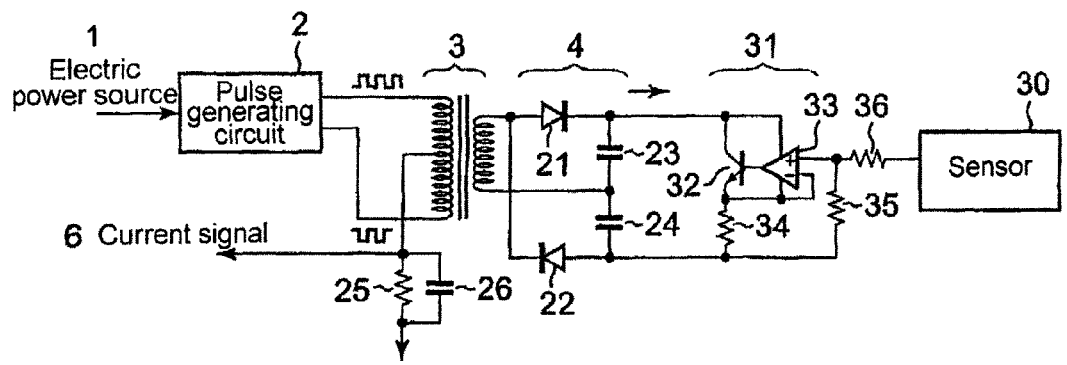
FIG. 4 is a diagram showing a circuitry according to the invention for driving a sensor which outputs measurement result as change in voltage or electric resistance.
Figure 11:
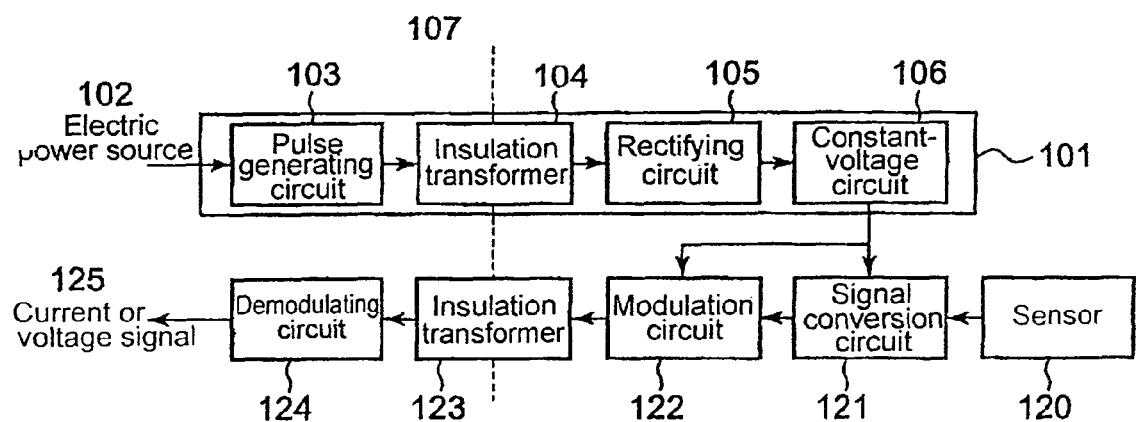
FIG. 11 a block diagram of a conventional circuit for measuring temperature using a sensor 120 such as a thermocouple for determining temperature by its thermoelectric power (voltage) or a thermistor for determining temperature by measuring electric resistance thereof.
Figure 12:
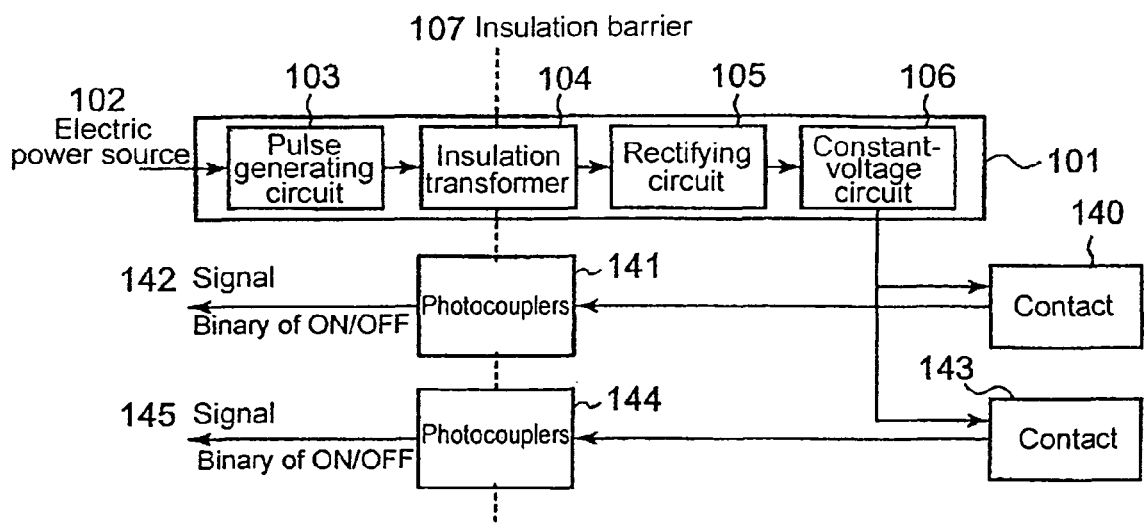
FIG. 12 is a block diagram of a conventional circuit in which a control means having contacts 140 and 143, which outputs ON/OFF signal upon detecting that pressure or temperature reaches a prescribed value and is utilized for detecting ambient conditions.
Figure 13:
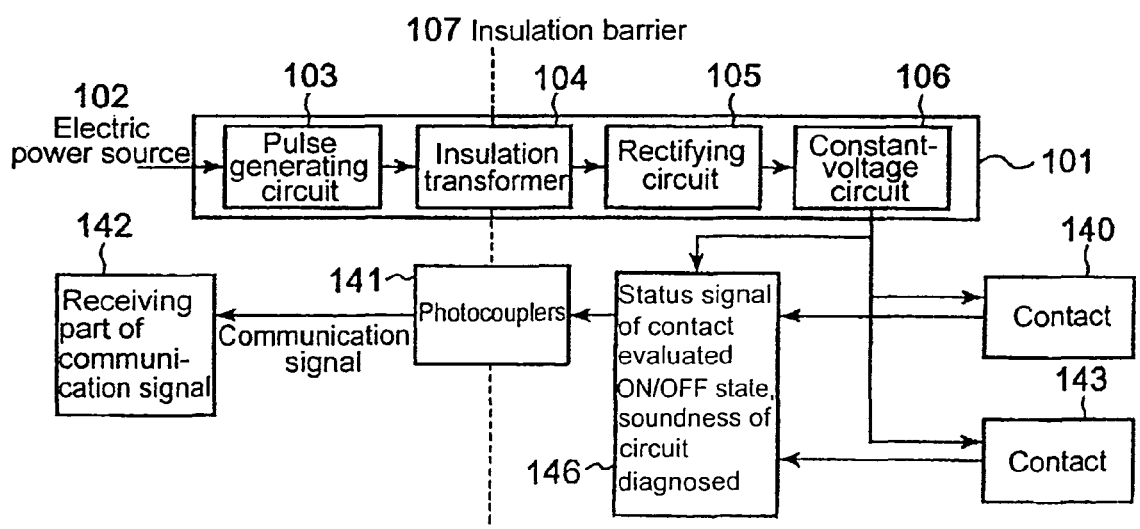
FIG. 13 is a block diagram of a conventional circuit provided with a circuit for performing diagnosis of signal status, in which a control means having contacts 140 and 143, which outputs ON/OFF signal upon detecting that pressure or temperature reaches a prescribed value and is utilized for detecting ambient conditions.

FIG. 3 is a block diagram of a circuit in the case of a sensor such as a thermocouple and resistance thermometer bulb, which outputs measurement result as a change of voltage or resistance in an analog fashion as explained referring to FIG. 11 of conventional circuit, and FIG. 4 is a concrete circuitry of the block diagram of FIG. 3. Constituent parts similar to those of FIGS. 1 and 2 are denoted by the same reference numeral. To explain briefly, reference numeral 1 is an electric power source, 2 is a pulse generating circuit, 3 is an insulation transformer, 4 is a rectifying circuit, 6 is a current signal flow in the primary side of the insulation transformer 3, 7 is a broken line indicating an insulation barrier, 30 is driven object such as a sensor like a thermocouple or resistance thermometer bulb which outputs measurement result as a change of voltage or resistance, 31 is a signal conversion circuit for consuming the measurement result of the sensor 30 as a corresponding current.

In FIG. 4, reference numeral 25 is a resistance for measuring the current 6, 26 is a condenser, 32 is a transistor, 33 is an amplifier, and 34, 35, 36 is a resistance.

In the circuit shown in FIG. 3, the sensor 30 is a type of a sensor of which electromotive force (voltage) or resistance varies in accordance with its temperature like a thermocouple or resistance thermometer bulb, so the measurement result can not be transmitted to the instruction side as it is. Therefore, the signal conversion circuit 31 which is shown in detail in FIG. 4 is used. In order to convert the measurement result of the sensor (voltage or current) which varies in accordance with its temperature into an appropriate signal, the signal conversion circuit 31 composed of the transistor 32, amplifier 33, and resistances 34-36 is provided.

In the circuit shown in FIG. 3 and FIG. 4, the pulse generated by the pulse generating circuit 2 is raised in voltage by the insulation transformer 3 similarly as in the case of FIGS. 1 and 2, rectified by the rectifying circuit 4 composed of the diodes 21 and 22, and condensers 23 and 24, and supplied to the signal conversion circuit composed of the transistor 32, amplifier 33 and resistances 34-36 as an electric power. The measurement result of the sensor 30 is inputted to the signal conversion circuit 31 to be rendered into a current corresponding to the measurement result. To be more specific, in the circuit of FIG. 4, when the voltage which is the measurement result of the sensor 30 is inputted to the amplifier 33 via the resistance 36, it is amplified and applied to the base of the transistor 32, and a current corresponding to the measurement result flows in the transistor 32.

Therefore, a current corresponding to the current in the signal conversion circuit 31 flows in the primary side of the insulation transformer 3. By measuring the primary side current 6 flowing from the intermediate tap of the insulation transformer 3 via the resistance 25 and condenser 26 by an ammeter not shown in the drawing, voltage in the sensor 30, i.e. the measurement result can be estimated. In addition, when there occurs an abnormality such as a breaking of wire or short circuit in the circuit, the primary side current becomes 0 or excessive, which enables the diagnosis of circuit soundness.

By composing a circuit like this, the voltage which is the measurement result of the measuring transmitter 20 or sensor 30 can be estimated by measuring the current in primary side of the insulation transformer 3. Therefore, a drive circuit able to transmit the measurement result in an analog fashion of the measuring transmitter 20 and sensor 30 with a high degree of accuracy can be provided without providing the circuits and devices as shown in FIGS. 10 and 11 of conventional circuit such as the signal conversion circuits 108 and 121, modulating circuits 109 and 122, insulation transformer 110 and 113, and demodulating circuit 111 and 124.

FIG. 5 is a block diagram of the circuit in the case of a control means having a contact for switching on/off upon detecting that pressure or temperature reaches a prescribed value and being utilized for detecting ambient conditions, the means being supplied with electric power, and FIG. 6A is a concrete circuitry of the block diagram of FIG. 5. Constituent components similar to those in FIGS. 1-4 are denoted by the same reference numeral. To describe briefly, reference numeral 1 is an electric power source, 2 is a pulse generating circuit, 3a, 3b is an insulation transformer, 4a, 4b is a rectifying circuit, and a broken line 7 indicates an insulation barrier. Reference numeral 55, 56 is a control means such as a contact switching ON/OFF depending on pressure or temperature (hereafter referred to as the contact depending on circumstances), 57 is a control microcomputer which evaluates condition of the contacts 55, 56 in an analog fashion based on the primary side current of the insulation transformer 3 and diagnoses the ON/OFF condition of the contacts and soundness of the circuit such as whether there is a breaking of wire or short circuit occurred in the circuit.

The contact 55(56) consists of a resistance 60, 61 and a contact 62 which is switched on/off depending on pressure or temperature, as shown in FIG. 6A as an example.

The contact 62 is switched on/off in accordance with pressure or temperature, and both the resistances 60 and 61 are connected to the rectifying circuit 4 when it is "ON" and only the resistance 61 is connected to the rectifying circuit 4 when it is "Off" in order to detect the On/OFF state thereof so that resistance changed depending on the ON/OFF state of the contact 62. As the current flow in the secondary side of the insulation transformer 3 changes in accordance with the resistance value, ON/OFF state of the contact 62 which depends on whether the pressure or temperature has reached the prescribed value or not can be detected by measuring the primary side current.

FIG. 6B shows primary side current in the ordinate and the abscissa has no meaning, the vertical line to show current ranges are shifted horizontally only to make clear the boundaries of the ranges. In FIG. 6B, a region indicated by "short circuit" is when there is a short circuit, "ON" is when the contact 62 is in the state of ON, "OFF" is when the contact 62 is in the state of OFF, "INFINITE" between "ON" " and "OFF" is when a trouble such as a partial burned stick occurred in the contact, and "WIRE BREAK" is when there is breaking of wire.

Therefore, by providing an transformer 3 for each contact, and providing in the instruction side a microcomputer 57 for estimating the measurement result based on the primary side current of the insulation transformer, ON/OFF state of the contact 62 (contact 55 (56) in FIG. 5), and whether there has occurred a trouble such as a breaking of wire or short circuit or burned stick of the contact can be monitored. Furthermore, by providing an insulation transformer for each of the contacts 55 and 56, the contact 56 can be insulated from the contact 56, the control microcomputer 57 can be located in the instruction side, and estimation of control status and diagnosing of the circuit can be performed with high accuracy while evading increase in manufacturing cost due to increase of the number of parts and complication of the circuit.

It is a matter of course that, in the case of the measuring transmitter 20 and sensor 30 as shown in FIG. 1 and FIG. 2, when a plurality of them are used, the electric power source and pulse generating circuit can be used in common for each of them.

Industrial Applicability

According to the invention, provision of means for confirming the signal status and diagnosing the soundness of circuit, which has been hesitated in the past because of increase in manufacturing cost, can be implemented with simple construction and without increase in the number of constituent elements, complication of the circuit configuration, and increase in manufacturing cost. The invention can be applied easily to an electric circuit which is required particularly to be highly reliable.

The invention claimed is:

1. A device for diagnosing signal status in measurement and control by a driven object, the device comprising:
a voltage generating means for generating a pulse voltage and an alternating voltage,
a measuring means of which a current, a voltage, or a resistance varies is changed, or a driven object which converts a change of state of a controlling object into a change of a current, a voltage, or a resistance,
a rectifying circuit, and
a transformer having a primary side connected to the voltage generating means, and a secondary side connected to the measuring means or the driven object through the rectifying circuit,
wherein the transformer is an insulation transformer of which the primary side is insulated from the secondary side,
a primary winding is provided with an intermediate tap,
a current measuring means is connected to the intermediate tap to measure a current in the primary side of the transformer caused by a current flow in the driven object connected to the secondary side via the rectifying circuit, and
a detection of a change in the current, the voltage, or the resistance of the driven object and an evaluation of soundness of a circuit are performed based on a measurement result of the current measuring means.

2. A device for diagnosing signal status in measurement and control according to claim 1, wherein
said driven object is a measuring transmitter which converts the measurement result into an analog current value and outputs the analog current value,
the detection of the current, the voltage, or the resistance in the driven object and the evaluation of soundness of the circuit are performed by measuring a change in a current on the intermediate tap in the primary side of the transformer caused by a current applied to said measuring transmitter via said rectifying circuit by said current measuring means.

3. A device for diagnosing signal status in measurement and control according to claim 1, wherein
said driven object is a sensor which outputs the measurement result as a voltage or a change in resistance and which has a signal conversion circuit for converting output of the sensor into a current value, and
the detection of the current, the voltage, or the resistance in the driven object and the evaluation of soundness of the circuit are performed by measuring a change in a current on the intermediate tap in the primary side of the transformer caused by a current which flows from the rectified circuit to said signal conversion circuit by said current measuring means.

4. A device for diagnosing signal status in measurement and control according to claim 1, wherein
said driven object is a control means which switches on/off in accordance with ambient conditions including pressure, temperature, and humidity,
the control means has a means for switching resistance values in accordance with ON/OFF state of said control means, and,
the device further comprises a diagnosing means which detects a change in a current on the intermediate tap in the primary side of the transformer caused by a current which flows from the rectifying circuit to the resistance by said current measuring means and which detects whether said control means is switched-on or -off and diagnoses circuit soundness.

* * * * *